(12) United States Patent  
Brandl

(10) Patent No.: US 7,396,482 B2  
(45) Date of Patent: Jul. 8, 2008

(54) POST EXPOSURE RESIST BAKE

(75) Inventor: Stefan Brandl, Albany, NY (US)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 11/262,420

(22) Filed: Oct. 28, 2005

(65) Prior Publication Data

US 2007/0099429 A1 May 3, 2007

(51) Int. Cl.  
*B44C 1/22* (2006.01)

(52) U.S. Cl. .......... 216/66; 438/530; 438/708; 430/326

(58) Field of Classification Search .......... 438/522, 438/530, 708; 430/314, 326, 3; 216/58, 216/62, 66  
See application file for complete search history.

(56) References Cited

U.S. PATENT DOCUMENTS

| | | | |
|---|---|---|---|
| 6,132,940 A * | 10/2000 | Mih et al. | 430/394 |
| 6,372,408 B1 | 4/2002 | Lu et al. | |
| 6,379,869 B1 | 4/2002 | Schroeder et al. | |
| 6,383,715 B1 | 5/2002 | Lu et al. | |
| 6,420,101 B1 | 7/2002 | Lu et al. | |
| 6,503,693 B1 * | 1/2003 | Mohondro et al. | 430/328 |
| 6,670,646 B2 | 12/2003 | Lu et al. | |
| 6,770,423 B2 | 8/2004 | Rottstegge et al. | |
| 6,878,508 B2 * | 4/2005 | Watanabe et al. | 430/325 |
| 6,986,981 B2 * | 1/2006 | Yamato et al. | 430/270.1 |
| 6,998,221 B2 * | 2/2006 | Kirmse | 430/313 |
| 2003/0108818 A1 * | 6/2003 | Livesay et al. | 430/328 |
| 2004/0265706 A1 | 12/2004 | Montgomery et al. | |
| 2005/0266335 A1 * | 12/2005 | Johnson et al. | 430/270.1 |

OTHER PUBLICATIONS

Hinsberg, W. D., et al., "Chemical and physical aspects of the post-exposure baking process used for positive-tone chemically amplified resists", IBM J. Res. & Dev., Sep. 2001, pp. 667-682, vol. 45, No. 5.

* cited by examiner

*Primary Examiner*—Lan Vinh  
(74) *Attorney, Agent, or Firm*—Slater & Matsil, L.L.P.

(57) ABSTRACT

A preferred embodiment of the invention provides a method for forming an integrated circuit. The method comprises forming a resist layer on a substrate. Preferably, the photoresist layer comprises a photo acid generator (PAG). Embodiments include irradiating the resist through a mask to generate a photoacid in the resist, heating the resist at a first temperature, and then heating the resist at a second temperature. Heating at the first temperature evaporates water from the resist. Heating at the second temperature deprotects the resist.

20 Claims, 2 Drawing Sheets

POST EXPOSURE RESIST BAKE

TECHNICAL FIELD

This invention relates generally to photolithography in the field of integrated circuit manufacture, and more particularly to a method of improving defectivity of chemically amplified resists.

BACKGROUND

Lithography is widely used in the manufacture of integrated circuits. In lithography, and more particularly photolithography, a photoresist layer is formed on a semiconductor substrate. The photoresist is then exposed in certain areas to actinic radiation. The areas that are irradiated are defined by a mask which is projected onto the photoresist by a lens system. The mask contains a pattern of transparent and opaque areas. The mask is exposed to actinic radiation, such as ultraviolet light (UV), which is transmitted through the transparent areas of the mask to cause a chemical reaction in corresponding regions of the photoresist.

In a negative type photoresist the radiation impacted areas of the photoresist become insoluble in a developing solvent. For example, the radiation can initiate cross-linking, chain growth, photocondensation, or other such reaction to cause a chemical change in the photoresist. In a positive type photoresist the irradiated areas become more soluble in a developing solvent. For example, the radiation can cause photodegradation of the photoresist molecular structure.

Advancements in photoresist materials and methods have played a key role in the miniaturization of integrated circuits. Chemically amplified resists are an important class of photoresists for imaging wavelengths at or below 248 nm. Chemically amplified resists typically include four components: a base polymer with protected chemically reactive, hydrophobic groups; a photoacid generator (PAG); a base; and a solvent. Upon exposure to UV or other type of actinic, or activating, radiation, the PAG photodecomposes and generates a proton, $H^+$. During a later post-exposure bake (PEB), the $H^+$ acts as a catalyst to convert the hydrophobic protected groups on the base polymer into strong hydrophilic groups such as —COOH. This conversion, which is often called deprotection, makes a positive resist soluble in the developer.

One problem encountered with chemically amplified resists is the presence of water in the post exposure resist. The high affinity of the photo-generated proton for water severely interferes with its catalytic performance. Spatial variations in water concentration therefore causes uneven development, which in turn causes line broadening, blobs, and other defects in the completed integrated circuit.

In light of such problems, there is a need for improved methods and materials in high-resolution lithography.

SUMMARY OF THE INVENTION

These and other problems are generally solved or circumvented, and technical advantages are generally achieved, by preferred embodiments of the present invention that provide a method for lowering the water concentration in exposed, chemically amplified resists.

A preferred embodiment of the invention provides a method for forming a semiconductor device. The method comprises forming a resist layer on a substrate. Preferably, the photoresist layer comprises a photo acid generator (PAG). Embodiments include irradiating the resist through a mask to generate a photoacid in the resist, heating the resist at a first temperature, and heating the resist at a second temperature. Preferably, the second temperature is greater than the first temperature.

Other embodiments provide an immersion lithography method for forming an integrated circuit feature such as a contact hole or via having a critical dimension. The method comprises forming a photoresist layer on a substrate, wherein the photoresist layer includes a photoacid generator (PAG). Embodiments include exposing the photoresist layer to a level of radiation suitable for generating a photoacid within the photoresist layer. Preferred embodiments include heating the exposed photoresist layers evaporating water from the exposed photoresist, and then heating it to a second temperature to deprotect the photoresist layer.

Still other embodiments of the invention provide a method of patterning a resist. The method comprises forming a resist on a substrate, irradiating the resist to generate a photoacid in the resist, and reacting the resist with photoacid. Preferred embodiments further include baking the resist at a temperature sufficient to remove water from the resist before reacting the resist. Embodiments advantageously reduce the incidence of water-induced pattern defects.

Note that although the term layer is used throughout the specification and in the claims, the resulting features formed using the layer should not be interpreted together as only a continuous or uninterrupted feature. As will be clear from reading the specification, the semiconductor layer will be separated into distinct and isolated features (e.g., active regions or device fabrication regions), some or all of which comprise portions of the semiconductor layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts.

Figure 1:
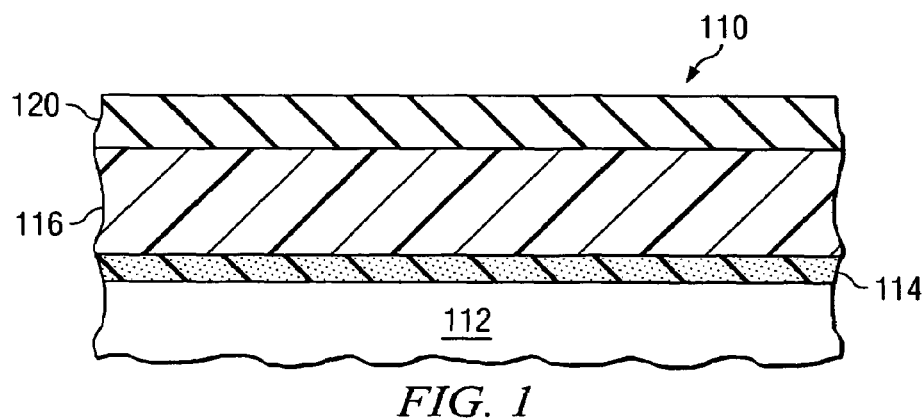
FIG. 1 is a cross sectional view a of chemically amplified resist according to an embodiment of the invention.

Referring now to FIG. 1, there is shown a cross sectional view of a semiconductor structure 110 comprising a semiconductor body 112 upon which has been deposited an anti-reflection coating (ARC) 114, and upon this ARC 114 has been deposited a photoresist layer 116. It is desired to expose selected areas of the photoresist layer 116 to a pattern of light that will result in these selected areas of the photoresist layer 116 being removed from the semiconductor structure 110 when the photoresist layer 116 is developed. Embodiments may further include a protective topcoat layer 120 over the photoresist layer 116. In a more particular application, preferred embodiments may be used to form a recessed feature, such as a via or a contact hole, in an integrated circuit at an intermediate fabrication stage. In an embodiment of the invention, the via or contact hole may have a critical dimension less than about 100 nm.

The ARC 114 may comprise chrome oxynitride, titanium nitride, silicon nitride, or molybdenum silicide, for example. In preferred embodiments, the photoresist 116 may be a positive or negative photoresist. With a negative photoresist, the exposed areas become less soluble in a developing solvent, for example by cross-linking of the polymer chains of the base resin. With positive photoresists, the exposed areas become more soluble, for example by degradation or the formation of more soluble groups on the molecular chain. Aromatic groups tend to block transmission of UV radiation, especially at shorter wavelengths. Hence, for use with 200 nm to 250 nm UV radiation the base resin should have a reduced amount of aromatic groups ranging from 0% to about 20% by weight of aromatic content. For use with UV radiation having wavelengths of less than 200 nm, the base resin in the photoresist should contain substantially no aromatic groups.

In preferred embodiments, the photoresist 116 includes a photoacid generator (PAG), which generates an acid upon suitable exposure to radiation. Typically, the PAG is tailored to the exposure wavelength. For example, a 248 nm photoresist includes a PAG that strongly absorbs KrF excimer laser light. In addition to the PAG, the photoresist includes a base resin that undergoes an acid catalyzed chemical reaction. Such photoresists are well known in the art.

In preferred embodiments, base resin includes a reactive component, in addition to the PAG, that is initially made non-reactive using a protecting group. Chemical protecting groups are commonly known in the chemical arts, particularly in organic synthesis. Exposing the photoresist removes the protecting group and causes the photoresist to chemically react. With a chemically amplified photoresist, the process is catalyzed by a photoacid generated by the PAG.

Suitable chemically amplified photoresists include functional groups (or active sites) such as hydroxyl (—OH), carboxyl (—COOH), mercapto (—SH), amino (—NH$_2$), alkylamino (—NHR), imino (—NH—), formyl (—CHO), sulfo (—SO$_3$H), an phosphono (—P(O)(OH)$_2$). Hydroxyl and carboxyl are preferred. The active sites can be protected with a suitable blocking agent having protecting groups. Suitable protecting groups include, e.g., benzyloxycarbonyl, trifluoroacetyl, benzyl ester, t-butyl ester, N-hydroxysuccinimide ester, and the like. A preferred blocking agent for the includes tert-butoxycarbonyl groups (t-BOC).

By way of example, a suitable chemically amplified photoresist resin, or more conveniently, a base resin, for the positive or negative photoresist may be selected from polyhydroxystyrene, polymethylmethacrylate, poly(t-butyl) methacrylate, polyvinyl alcohol, polyvinylphenol, polynorbonene, poly(p-formyl)oxystyrene, poly(t-butoxycarbonyloxystyrene), polyvinylpyrrolidone, polymethylisoprenylketone, phenolformaldehyde polymers, melamine-formaldehyde polymers, and copolymers, blends and derivatives of these resins.

Suitable photoacid generators include, for example, diaryliodonium salts, triarylsulfonium salts, and substituted aryldiazonium salts, the salts having counterions such as tetrafluoborate, hexafluoroantimonate, hexafluoroarsenate and hexafluorophosphate. Other photoacid generators are halomethanes, trichlorotriazine, a-naphthol, nitrobenzaldehyde and polyvinylchloride.

The photoresist 116 may include additional substances used in conventional resist formulations. These additional substances may include, for example, additional polymers, sensitizers, crosslinking agents, speed enhancers, flexibility enhancers, adhesion enhancers, heat resistance enhancers, and surfactants. Such components are well known in the art. Examples of sensitizers are diazoquinones such as naphthoquinone-(1,2)-diazide sulfonic acid esters, and particularly the 5-sulfonic acid ester of diazonaphthoquinone. Formulated photoresists and photoresist components are widely available from commercial suppliers.

In preferred embodiments 248 nm base resins include phenolic-containing resins, e.g., poly(hydroxystyrene) polymers. Preferred 193 nm base resins include poly(meth)acrylates; copolymers of cyclic olefins and maleic anhydride; cyclic olefin addition polymers; cyclic olefin-maleic anhydride-(meth)acrylate hybrid polymers and cyclic olefin-(meth)acrylate polymers.

The photoresist 116 applied to a substrate body 112, which may comprise a silicon wafer, in a conventional manner. Usually, the photoresist solution is applied to a silicon wafer, which is then spun to distribute the photoresist in the form of an even layer over the wafer. The photoresist 116 is then mildly heated to about 100° C. to drive off the solvent. The preferred thickness of the photoresist layer 116 is preferably no more than about 1 micron, preferably no more than about 0.8 microns, more preferably no more than about 0.5 microns, and most preferably no more than about 0.3 microns.

Continuing with FIG. 1, the topcoat 120 may comprise the same material used to form the ARC 114. Preferably, the topcoat 120 is matched with the refractive index of the photoresist 116. In preferred embodiments of the invention, the refractive index of protective topcoat layer 120 is approximately equal to the square root of the refractive index of the chemically amplified photoresist layer 116 multiplied by the refractive index of the immersion medium.

Figure 2:
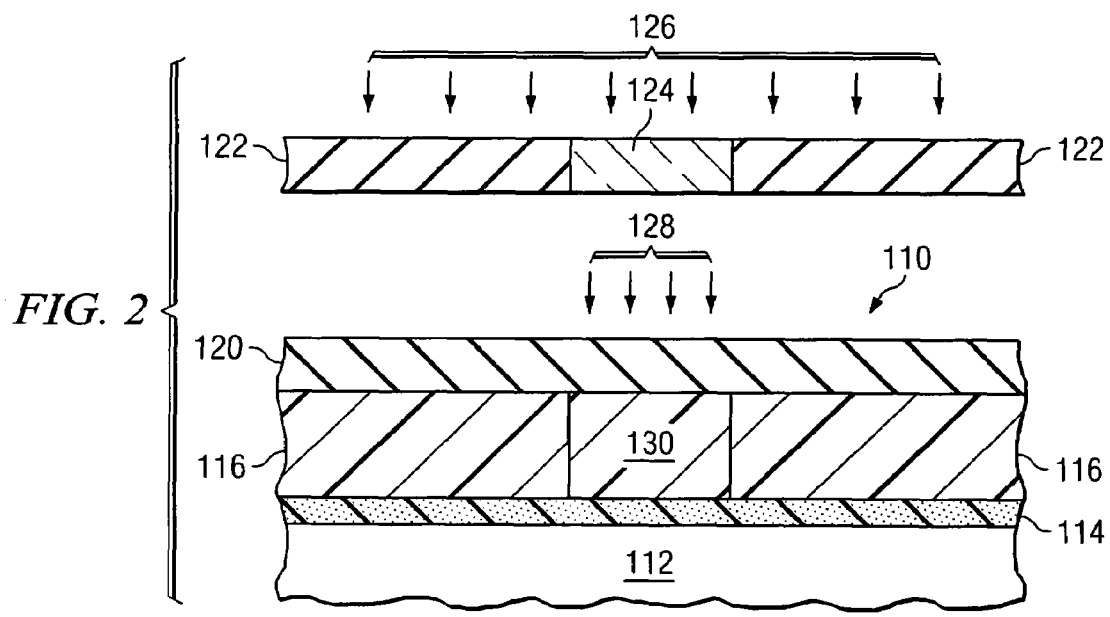
FIG. 2 is a cross sectional view illustrating irradiation of a photo acid generator (PAG) according to an embodiment of the invention.

Turning now to FIG. 2, the semiconductor structure 110 is the photoresist layer 116 is exposed to patterned light 128. A patterned opaque mask 122 with a transparent portion 124 is illuminated by non-patterned light 126, with patterned light 128 being transmitted through the transparent portion 124 and impinging upon photoresist 116. The patterned light 128 preferably comprises short wavelength UV actinic radiation having a wavelength of about 248 nm and more preferably far UV having a wavelength less than about 200 nm, such as used in immersion lithography, for example. The patterned light 128 may have an energy dosage of about 10 to about 200 mJ/cm$^2$. The patterned light 128 results in a portion 130 of photoresist 116 being changed or modified so that the portion 130 will be dissolved and removed when subjected to a photoresist developer solution.

As noted above, water in the exposed resist can degrade the resolution of lithography. This is of particular concern with immersion lithography, which uses water as a refractive medium between the exposure tool lens and the photoresist. One function of the topcoat layer in immersion lithography is to prevent photoresist components from leaching out into the water. The topcoat layer is not a complete barrier to water, however. Therefore, diffusional and osmotic forces drive water from the refractive medium into the resist. If there is any inhomogeneity in the topcoat (e.g., thickness variation, pinhole, etc.) there is generated a local water variation in the resist, which locally alters the deprotection and development chemistry in the resist and degrades resolution. Therefore, preferred embodiments of the invention, include a dual stage post exposure bake (PEB).

In preferred embodiments, the first stage of the PEB removes water from the photoresist. The second stage of the PEB performs the deprotection reaction commonly used for chemically amplified resists.

As is known in the art, the deprotection step exposes active sites of the base resin for reacting with the developing solution. The deprotection typically includes a heat treatment, which amplifies the acid generated the exposure. The acid, in turn, deprotects the base resin during the heat treatment by exposing the active groups (e.g. hydroxyl, carboxyl, etc.). The exposed active groups thus become available for reaction. The heat activation that achieves deprotection is conducted at a temperature 100° C. and 150° C. for between about 1 minute to about 5 minutes.

Preferred embodiments of the invention, however, preferably comprise first stage PEB, under conditions sufficient for reducing the resist water concentration to a suitable level. The first stage PEB preferably further comprises maintaining the temperature below that which is needed to active the deprotection reaction kinetics to an appreciable degree. Applicants find that a preferred first stage PEB comprises baking below 100° C. More preferred conditions comprises baking at about 80° C. for about 60 seconds.

Figure 3A:
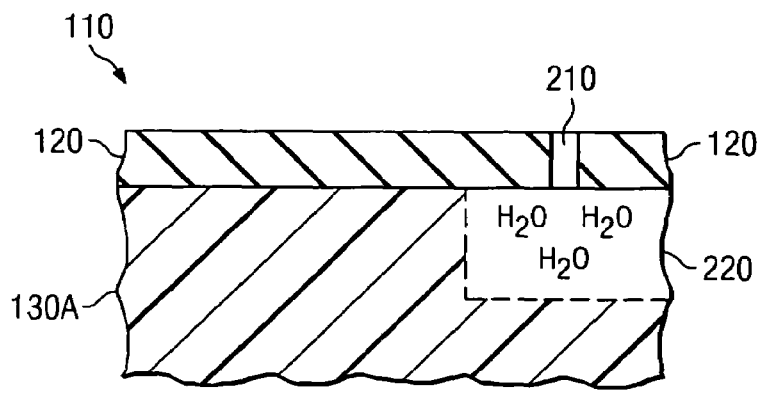
FIGS. 3A-3C is a cross sectional view illustrating the dual stage, post-exposure bake according to embodiments of the invention.
Figure 3B:
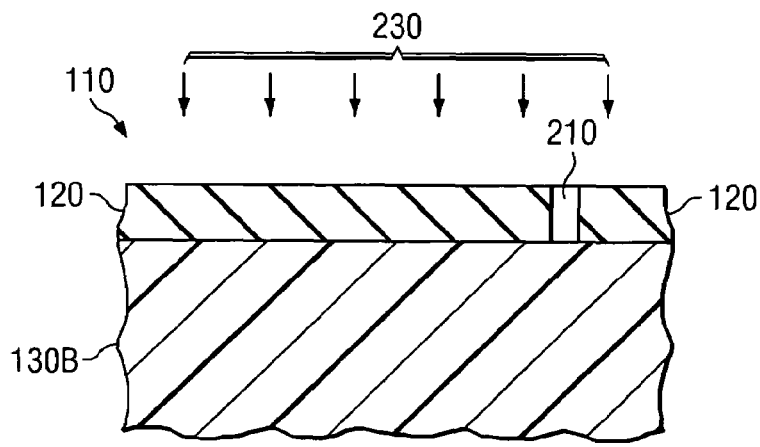
Figure 3C:
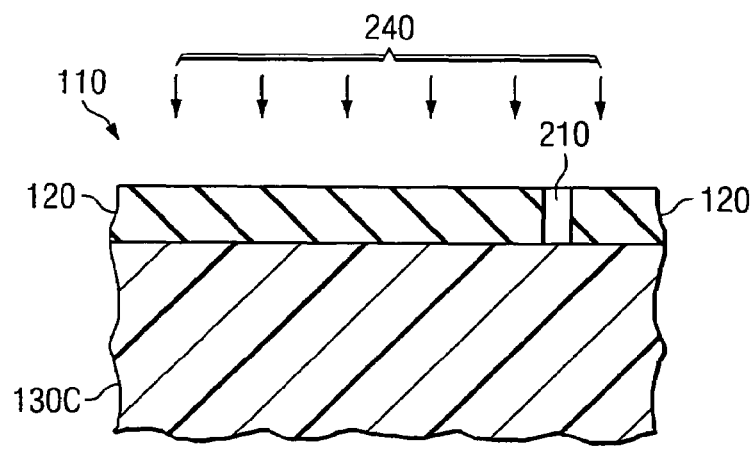

FIG. 3A illustrates a portion of the semiconductor structure 110 of FIG. 2 before performing the dual stage PEB according to an embodiment of the invention. The topcoat layer 120 includes a defect 210 such as a pinhole, which allows water from the immersion medium (not shown) to enter the exposed resist 130. Included within the exposed resist 130 is a localized region 220 of increased water concentration. FIG. 3B shows the first stage of the dual stage PEB. The first stage preferably includes a first heat treatment 230 sufficient to suitably remove the local region 220 (FIG. 3A) of increased water concentration. FIG. 3C shows the second stage of the dual stage PEB. The second stage preferably comprises a second heat treatment 240 that deprotects the exposed resist 130.

Figure 4:
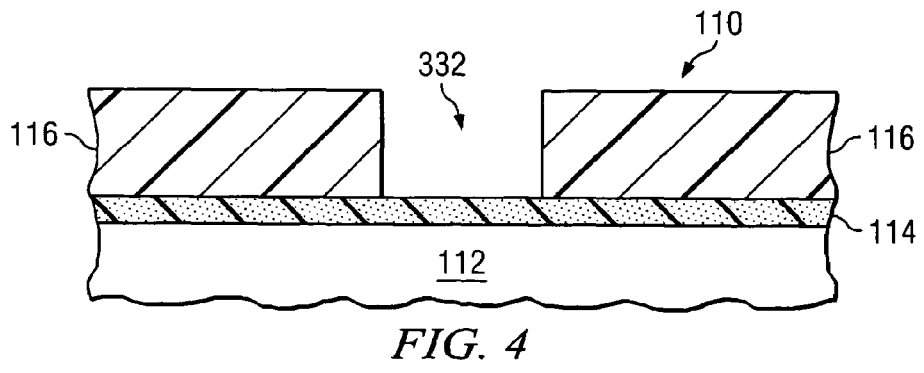
FIG. 4 is a cross sectional view illustrating a patterned resist according to an embodiment of the invention.

FIG. 4 shows the semiconductor structure 110 after the dual stage PEB and after development of the photoresist layer 116 and removal of the topcoat layer. This results in a portion of photoresist 116 being removed and an opening 332 in the remaining photoresist layer 116.

Conventional processing may complete the semiconductor structure 110. For example, a final recessed feature, such as a contact hole having a critical dimension CD is formed in the substrate 220. The process may include known etching process such as wet etching or, preferably, plasma etching. Wet etching is usually accomplished with acid etchants such as hydrofluoric acid. Plasma etching is preferred because it can be performed anisotropically, leaving sharper edge profiles. Plasma etching can be accomplished with oxygen-containing etch gas. Since plasma etching can degrade the photoresist, embodiments may further include silylation for imparting etch resistance to the photoresist wherein oxygen plasma is used.

Although the present invention and its advantages have been described in detail, it should be understood that various changes, substitutions and alterations may be made herein without departing from the spirit and scope of the invention. For example, the ARC layer may or may not be used. Resist materials other than photoresists may be used, for example, an electron beam (e-beam) sensitive resist or an x-ray sensitive resist may be used. Exposure of the resist by means other than light may be used, for example, exposure of the resist by electron beams, ion beams, or x-ray beams. Various methods of photoresist development other than that which dissolves the exposed photoresist may be used. The embodiments described herein are equally suitable for front end of the line (FEOL) or back end of the line (BEOL) processing. Embodiments of the invention are suitable for wafers, intermediate devices, or finished devices. Nor are embodiments of the invention limited to a specific sequence of steps.

For example, embodiments encompass a process sequence where a low temperature water bake is performed before exposing the resist. The low temperature is not limited to a specific temperature range, but it is preferably sufficiently low to keep the deprotection reaction kinetics suitably slow. Those skilled in the art know that a pre-wet puddle process may precede exposure to leach deleterious chemicals from the resist. Such a leach is preferably short, only about 10 seconds. Removing any absorbed water from the resist promotes uniform exposure by prevent leaching beyond the preferred period. Other embodiments may include a plurality of low temperature water removal baking steps. Accordingly, the appended claims are intended to include within their scope such processes, machines, manufacture, compositions of matter, means, methods, or steps.

What is claimed is:

1. An immersion lithography method for lowering the water variation in a resist during the forming of a semiconductor device, the method comprising:

forming a resist layer on a substrate, said resist layer having a top coat with an inhomogenity therein and said resist having a thickness;

using immersion lithography to expose the entire thickness of the resist layer to patterned irradiation prior to any heating to a temperature that is equal to or greater than a deprotection temperature, said inhomogenity in said top coat generating a local water variation in the resist layer and said patterned irradiation generating a photoacid throughout the entire thickness of the resist layer;

heating the exposed resist layer at a first temperature that is lower than the deprotection temperature of the resist layer to remove said local water variation;

heating the exposed resist layer at a second temperature subsequent to removing said water variation, wherein the second temperature is between a low temperature of about 100° C. and a high temperature at least equal to the deprotection temperature of said resist layer; and developing said entire thickness of the resist layer, subsequent to said steps of exposing and heating at said first and second temperatures, to provide a patterned resist.

2. The method of claim 1, wherein the second temperature is sufficient to cause chemical amplification of the photoacid.

3. The method of claim 2, wherein the first temperature is not sufficient to cause substantial chemical amplification of the photoacid.

4. The method of claim 1, wherein the first temperature is less than about 100° C.

5. The method of claim 1, further comprising heating the resist layer at the first temperature for about 1 minute, wherein the first temperature is about 80° C.

6. The method of claim 1, further comprising heating the resist layer at the second temperature for more than about 1 minute.

7. The method of claim 1, wherein the resist layer is selected from the group consisting essentially of poly(meth) acrylates, copolymers of cyclic olefins and maleic anhydride, cyclic olefin addition polymers, cyclic olefin-maleic anhydride-(meth)acrylate hybrid polymers, cyclic olefin-(meth) acrylate polymers, and combinations thereof.

8. The method of claim 1, wherein exposing the resist layer comprises irradiating at a wavelength less than about 248 nm.

9. The method of claim 1, further comprising heating the resist layer to a temperature that is lower than the deprotection temperature prior to said exposing step to drive off any solvent in the resist layer.

10. An immersion lithography method for forming an integrated circuit feature having a critical dimension, the method comprising:
  forming a photoresist layer on a substrate, said photoresist layer having a top coat with an inhomogenity therein and said photoresist layer having a thickness, wherein the photoresist layer includes a photoacid generator (PAG);
  using immersion lithography to expose the entire thickness of the photoresist layer to patterned radiation prior to any heating to a temperature that is equal to or greater than a deprotection temperature, said inhomogenity in said top coat generating a local water variation in the photoresist layer and said patterned radiation having a level suitable for generating a photoacid within the entire thickness of the photoresist layer;
  heating the exposed photoresist layer to a first temperature, the first temperature sufficient to evaporate water from the exposed photoresist layer to remove the local water variation, but lower than the deprotection temperature;
  heating the exposed photoresist layer to a second temperature between about 100° C. and 150° C., the second temperature sufficient to deprotect the entire thickness of the photoresist layer; and
  developing the exposed photoresist layer, subsequent to said steps of exposing and heating to said first and second temperatures, to provide a patterned photoresist layer.

11. The method of claim 10, wherein the integrated circuit feature comprises a contact hole.

12. The method of claim 10, wherein the integrated circuit feature comprises a via with a dimension less than about 100 nm.

13. The method of claim 10, wherein the level of radiation suitable for generating the photoacid within the photoresist layer comprises radiation less than about 248 nm.

14. The method of claim 10, wherein the level of radiation suitable for generating the photoacid within the photoresist layer comprises a radiation energy dosage of about 10 mJ/cm$^2$ to 200 mJ/cm$^2$.

15. The method of claim 10, further comprising heating the photoresist layer to a temperature that is lower than the deprotection temperature prior to said exposing step to drive off any solvent in the photoresist layer.

16. An immersion lithography method of patterning a resist, the method comprising:
  forming a resist having a thickness on a substrate prior to any heating to a temperature that is equal to or greater than a deprotection temperature, said resist having a top coat with an inhomogenity therein, wherein the resist comprises a photoacid generator;
  exposing the resist to patterned irradiation to generate a photoacid in the entire thickness of the resist;
  baking the exposed resist at a temperature sufficient to remove water from the resist but less than the deprotection temperature, said baking step occurring only after said entire thickness of said resist has been exposed to said patterned irradiation and before reacting the resist;
  reacting the entire thickness of the baked resist with the photo acid subsequent to said baking step; and
  developing the entire thickness of said resist, subsequent to said steps of exposing, baking, and reacting to provide a patterned resist.

17. The method of claim 16, wherein reacting the resist comprises chemical amplification of the photoacid.

18. The method of claim 16, wherein baking the exposed resist is not sufficient to cause substantial chemical amplification of the photoacid.

19. The method of claim 16, wherein baking the exposed resist comprises baking the exposed resist for less than about 1 minute at a temperature of less than about 100° C.

20. The method of claim 16, further comprising heating the baked resist to a temperature that is lower than the deprotection temperature prior to said exposing step to drive off any solvent in the resist.

* * * * *

UNITED STATES PATENT AND TRADEMARK OFFICE
CERTIFICATE OF CORRECTION

PATENT NO. : 7,396,482 B2  Page 1 of 1
APPLICATION NO. : 11/262420
DATED : July 8, 2008
INVENTOR(S) : Brandl It is certified that error appears in the above-identified patent and that said Letters Patent is hereby corrected as shown below:

In Col. 3, line 66, before "includes" insert --active sites--.
In Col. 4, line 37, after "116" insert --is--.
In Col. 4, line 56, delete "is" and insert --with--.
In Col. 4, line 63, delete "far" and insert --for--.
In Col. 5, line 26, after "generated" insert --by--.
In Col. 5, line 37, delete "active" and insert --activate--.
In Col. 8, line 32, delete "photo acid" and insert --photoacid--.

Signed and Sealed this

Fourteenth Day of October, 2008

JON W. DUDAS
*Director of the United States Patent and Trademark Office*